(12) United States Patent  (10) Patent No.: US 9,343,323 B2
Kamikubo  (45) Date of Patent: May 17, 2016

(54) METHOD OF PRODUCING APERTURE MEMBER

(71) Applicant: NuFlare Technology, Inc., Yokohama-shi (JP)

(72) Inventor: Takashi Kamikubo, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/732,001

(22) Filed: Jun. 5, 2015

(65) Prior Publication Data

US 2016/0056046 A1 Feb. 25, 2016

(30) Foreign Application Priority Data

Aug. 22, 2014 (JP) ................................. 2014-169665

(51) Int. Cl.
*H01L 21/308* (2006.01)
*H01L 21/78* (2006.01)
*H01L 21/84* (2006.01)
*H01L 21/306* (2006.01)

(52) U.S. Cl.
CPC ........ *H01L 21/308* (2013.01); *H01L 21/30604* (2013.01); *H01L 21/78* (2013.01); *H01L 21/84* (2013.01)

(58) Field of Classification Search
CPC ..................................................... H01L 21/308
See application file for complete search history.

(56) References Cited

U.S. PATENT DOCUMENTS

| 5,528,048 A | * | 6/1996 | Oae | B82Y 10/00 250/492.2 |
| 2002/0109090 A1 | * | 8/2002 | Nakasuji | B82Y 10/00 250/311 |
| 2007/0045534 A1 | * | 3/2007 | Zani | B82Y 10/00 250/309 |
| 2009/0014663 A1 | * | 1/2009 | Nishimura | B82Y 10/00 250/396 R |

FOREIGN PATENT DOCUMENTS

| JP | 2012-18741 | 1/2012 |
| JP | 2014-7361 | 1/2014 |
| JP | 2014-46657 | 3/2014 |
| JP | 5445030 | 3/2014 |

* cited by examiner

*Primary Examiner* — Lex Malsawma

(74) *Attorney, Agent, or Firm* — Oblon, McClelland, Maier & Neustadt, L.L.P.

(57) ABSTRACT

In one embodiment, an aperture member producing method includes applying a charged particle beam to a plurality of chip areas on a first substrate while changing a writing condition to write a first pattern corresponding to an aperture opening, processing the first substrate based on the written first pattern to form a second pattern, cutting out a chip area provided with the second pattern having desired accuracy from the first substrate to produce a template, allowing the template to come into contact with a resist overlying a front surface of a second substrate, separating the template from the hardened resist to pattern the resist with a transfer pattern, processing the second substrate using the transfer pattern as a mask to form a first recess, and etching a rear surface of the second substrate to form a second recess communicating with the first recess.

17 Claims, 7 Drawing Sheets

METHOD OF PRODUCING APERTURE MEMBER

CROSS-REFERENCE TO RELATED APPLICATION

This application is based upon and claims the benefit of priority from the prior Japanese Patent Application No. 2014-169665 filed on Aug. 22, 2014, the entire contents of which are incorporated herein by reference.

FIELD

The present invention relates to a method of producing an aperture member for a charged particle beam writing apparatus.

BACKGROUND

As LSI circuits are increasing in density, circuit linewidths required of semiconductor devices are becoming finer year by year. Formation of a desired circuit pattern on such a semiconductor device needs a high-accuracy original pattern (also called a reticle or a mask). The high-accuracy original pattern is produced using electron beam lithography technology with an electron beam writing apparatus.

The electron beam writing apparatus includes an electron gun, a blanking aperture member, a first shaping aperture member, a second shaping aperture member, a shaping deflector, and an electron lens for focusing an electron beam. An electron beam emitted from the electron gun is applied to the first shaping aperture member through the blanking aperture member. A first shaped aperture image formed by the first shaping aperture member is formed on the second shaping aperture member and is deflected by the shaping deflector. The first shaped aperture image optically overlaps the second shaping aperture member, so that the electron beam can be varied in size and shape. The resultant electron beam shaped in basic unit graphical form, such as a rectangle or a triangle, is applied to a target mask with high accuracy, thus writing a pattern.

An aperture member, such as the first shaping aperture member or the second shaping aperture member, is produced as follows: First, a resist applied to a front surface of a wafer substrate is patterned with an aperture shape (corresponding to an opening) by the electron beam writing apparatus. Next, the front surface of the wafer substrate is subjected to processing, such as development and etching, thus forming a first recess having the aperture shape in the front surface. Then, a rear surface of the wafer substrate opposite the first recess is subjected to back-etching to form a second recess such that the second recess communicates with the first recess, thus forming the opening extending through the wafer substrate. After that, the wafer substrate is subjected to dicing, or cut into a predetermined sized piece having the opening, thus producing the aperture member.

As described above, electron beam lithography has conventionally been performed for each formation of an aperture member. In producing a plurality of aperture members, the aperture members tend to have variations in aperture opening shape, leading to low reproducibility. Furthermore, since the produced aperture members each have a size of approximately several mm square, it is difficult to check accuracy of a pattern shape of each of openings in such small members by measurement with a dimension measuring device and a position measuring device.

DETAILED DESCRIPTION

In one embodiment, a method of producing an aperture member for a charged particle beam apparatus includes applying a charged particle beam to a plurality of chip areas on a first substrate while changing a writing condition to write a first pattern corresponding to an aperture opening in each chip area, processing the first substrate based on the written first pattern to form a second pattern, measuring dimensional accuracy and edge positional accuracy of the second pattern in each chip area, cutting out a chip area provided with the second pattern having desired dimensional accuracy and desired edge positional accuracy from the first substrate to produce a template, allowing a template pattern of the template including the second pattern to come into contact with a resist overlying a front surface of a second substrate, hardening the resist, separating the template from the hardened resist to pattern the resist with a transfer pattern corresponding to the template pattern, processing the second substrate using the transfer pattern as a mask to form a first recess in the front surface, and etching a rear surface of the second substrate to form a second recess communicating with the first recess such that an opening extending through the second substrate is formed.

An embodiment of the present invention will be described below with reference to the drawings.

Figure 1:
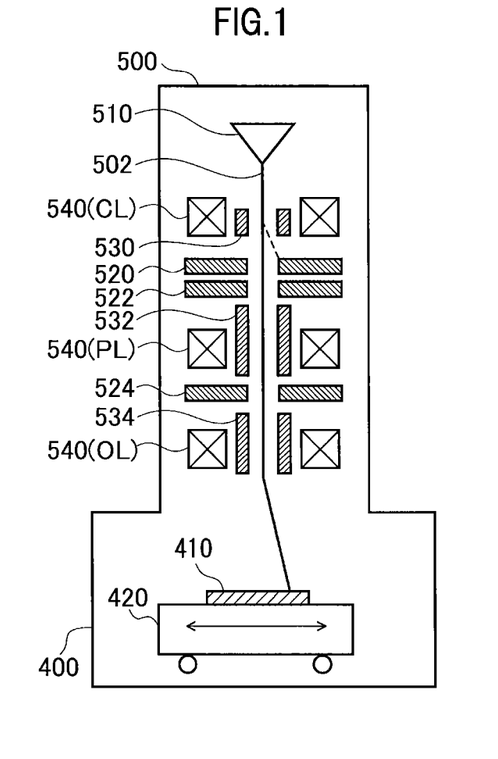
FIG. 1 is a schematic diagram of an electron beam writing apparatus.

FIG. 1 is a schematic diagram of a charged particle beam writing apparatus provided with aperture members according to the embodiment. In the present embodiment, a configuration using an electron beam, as an example of a charged particle beam, will be described. The charted particle beam is not limited to the electron beam. Any other charged particle beam, such as an ion beam, may be used.

The electron beam writing apparatus of FIG. 1 includes an electron beam lens barrel 500 and a writing chamber 400. The electron beam lens barrel 500 accommodates an electron gun 510, a blanking aperture member 520, a first aperture member 522, a second aperture member 524, a blanking deflector 530, a shaping deflector 532, an objective deflector 534, and lenses 540 (a condensing lens (CL), a projection lens (PL), and an objective lens (OL)). The writing chamber 400 accommodates an XY stage 420. A sample 410, serving as a writing target, is placed on the XY stage 420. The sample 410 is a wafer or an exposure mask for transferring a pattern to the wafer. This mask includes, for example, mask blanks on which any pattern is not formed.

An electron beam 502 emitted from the electron gun 510 is applied to the entire blanking aperture member 520 by the condensing lens CL. The beam passing through an opening of the blanking aperture member 520 and having a substantially uniform current density is applied to the entire first aperture member 522 having a rectangular, for example, square hole. The electron beam 200 is first shaped into a rectangle, for example, a square. The electron beam passing through the first aperture member 522 and corresponding to a first aperture image is projected onto the second aperture member 524 through the projection lens PL. The position of the first aperture image on the second aperture member 524 is controlled by the shaping deflector 532, so that the electron beam can be varied in shape and size.

The electron beam passing through the second aperture member 524 and corresponding to a second aperture image is focused by the objective lens OL and is deflected by the objective deflector 534. The resultant electron beam is applied to a desired position on the sample 410 on the X-Y stage 420, which is movably disposed. Such a configuration enables the electron beam writing apparatus to serve as a variable-shaped writing apparatus.

The blanking deflector 530 controls the electron beam 502 emitted from the electron gun 510 in such a manner that the electron beam 502 passes through the blanking aperture member 520 in a beam-ON mode and the whole of the electron beam 502 is deflected so as to be interrupted by the blanking aperture member 520 in a beam-OFF mode. The electron beam passing through the blanking aperture member 520 during transition from the beam-OFF mode to the beam-ON mode and then to the beam-OFF mode is an electron beam shot at one time. A dose of electron beam radiation per shot to the sample 410 is controlled depending on the time of radiation of each shot.

Figure 2:
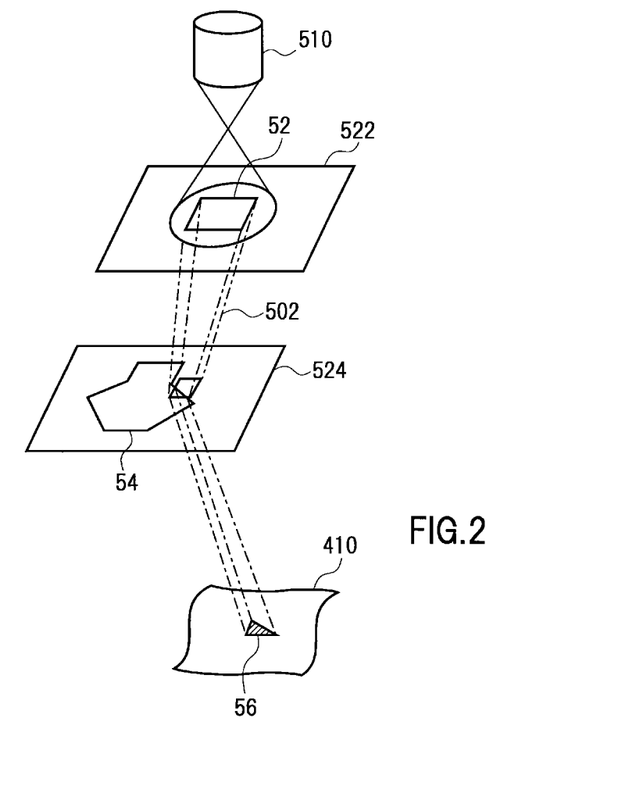
FIG. 2 is a diagram explaining beam shaping.

FIG. 2 is a schematic perspective view for explaining beam shaping by the first aperture member 522 and the second aperture member 524. The first aperture member 522 has a rectangular (elongated rectangular or square) opening 52 for shaping the electron beam 502.

Figure 3:
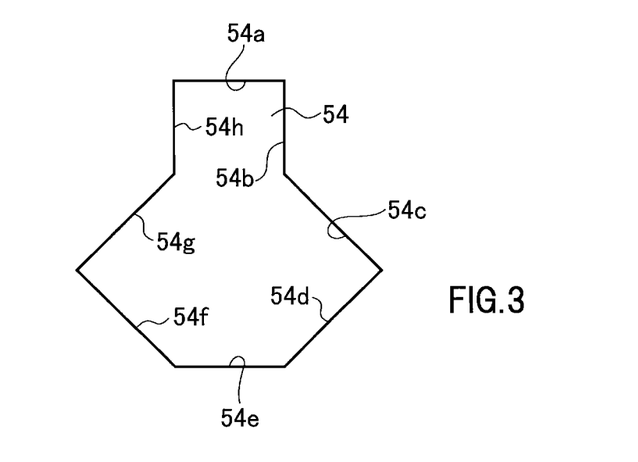
FIG. 3 is a schematic diagram of a variable-shaping opening.
Figure 4:
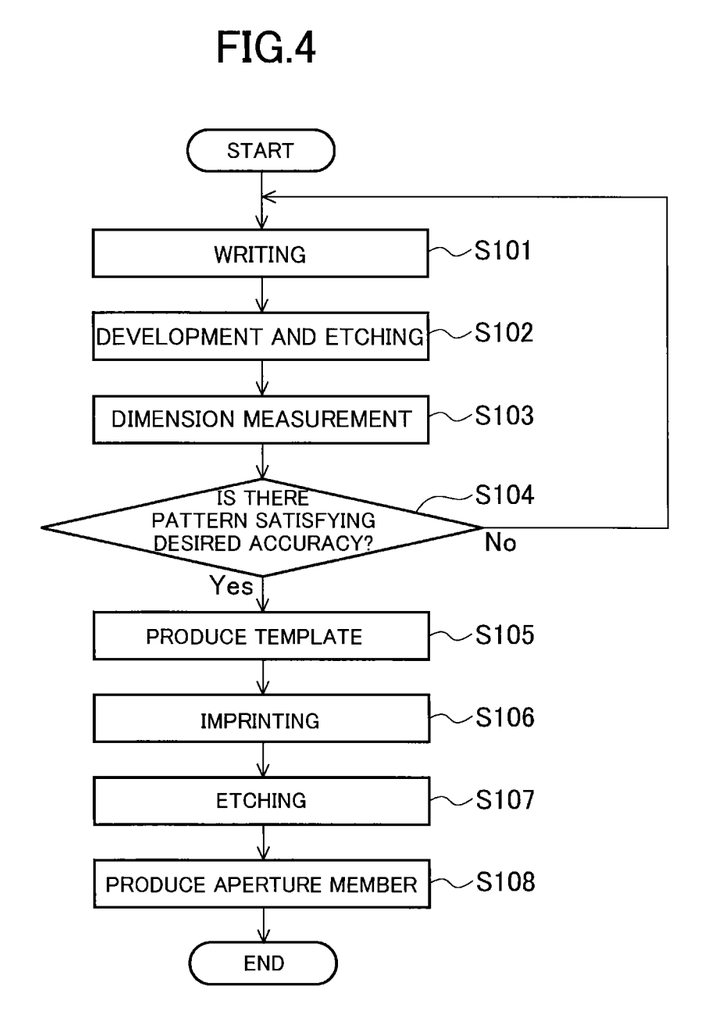
FIG. 4 is a flowchart explaining a method of producing an aperture member according to an embodiment.

The second aperture member 524 has a variable-shaping opening 54 for shaping the electron beam 502 passing through the opening 52 of the first aperture member 522 into a desired form. The variable-shaping opening 54 has a shape having sides 54a and 54e parallel to one side of the opening 52, sides 54b and 54h perpendicular thereto, and sides 54c, 54d, 54f, and 54g each forming an angle of 45 degrees or 135 degrees with one side of the opening 52, as illustrated in FIG. 3.

The shape of the variable-shaping opening 54 will now be described in detail. First ends of the sides 54f and 54d are connected by the side 54e. First ends of the sides 54b and 54h are perpendicularly connected to both ends of the side 54a. Second ends of the sides 54b and 54h are connected to first ends of the sides 54c and 54g. Second ends of the sides 54c and 54d are connected to each other. Second ends of the sides 54f and 54g are connected to each other. The variable-shaping opening 54 is shaped in an octagon including a hexagonal portion defined by the sides 54c to 54g and a rectangular portion defined by the sides 54a, 54b, and 54h and connecting to the hexagonal portion.

Referring to FIG. 2, the shape of a beam allowed to pass through both the opening 52 of the first aperture member 522 and the variable-shaping opening 54 of the second aperture member 524 is written in a writing region of the sample 410 placed on the XY stage 420 continuously moving in an X direction.

As illustrated in FIG. 2, the electron beam 502 is first shaped into a rectangle by passing through the opening 52 of the first aperture member 522 and is then applied to a region including the side 54c, forming an angle of 135 degrees, of the variable-shaping opening 54 of the second aperture member 524. Consequently, the rectangular electron beam shaped by the opening 52 partly passes through the variable-shaping opening 54 in such a manner that only the electron beam applied within the side 54c, forming an angle of 135 degrees, of the variable-shaping opening 54 is not interrupted by the second aperture member 524. Thus, the electron beam 502 is shaped so as to have an isosceles right triangular cross-section perpendicular to a beam axis. A beam shot 56 shaped in an isosceles right triangle is applied to the sample 410.

The components of the electron beam writing apparatus are controlled by a controller (not illustrated). The controller performs a plurality of data conversion processing steps on write data to generate shot data peculiar to the apparatus. As regards the shot data, for example, a figure type, a figure size, a radiation position, and radiation time are defined. An amount of deflection by the shaping deflector 532 is controlled based on the "figure type" and the "figure size" included in the shot data, an amount of deflection by the objective deflector 534 is controlled based on the "radiation position", and switching between the beam-ON mode and the beam-OFF mode by the blanking deflector 530 is controlled based on the "radiation time".

A method of making an aperture member, such as the blanking aperture member 520, the first aperture member 522, or the second aperture member 524, which is attached to the above-described electron beam writing apparatus, will now be described with reference to a flowchart of FIG. 4 and FIGS. 5 to 10.

Figure 5A:
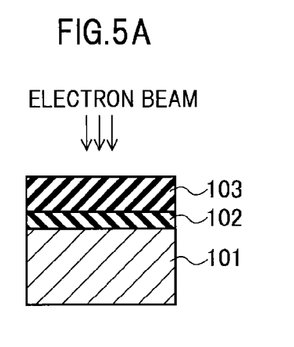
FIGS. 5A, 5B, and 5C are cross-sectional views explaining a process of producing a template in the embodiment.

[Step S101] As illustrated in FIG. 5A, a substrate 101 overlaid with a chromium film 102 and a resist 103 in that order is prepared. The substrate 101 is composed of a material that permits light, which will be described later, to pass through, for example, quartz glass. The chromium film 102 may be omitted. A chromium oxide film may underlie the resist 103. The resist 103 is patterned with a pattern corresponding to an aperture opening by using an electron beam writing apparatus as illustrated in FIG. 1. The resist 103 is of a negative type. An electron beam is applied to a portion corresponding to the aperture opening.

Figure 6:
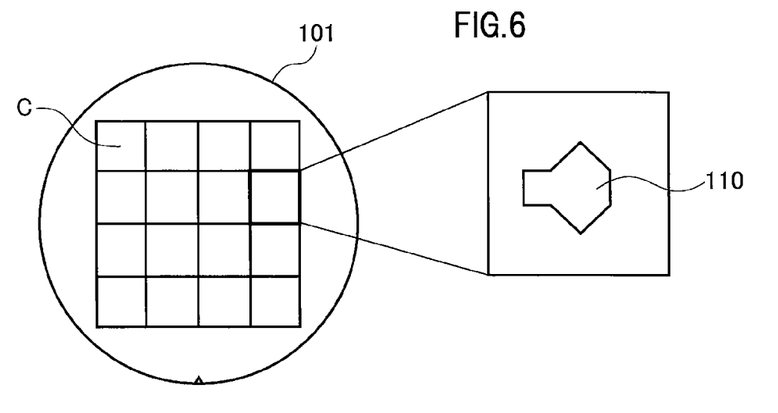
FIG. 6 is a top view of a substrate on which a pattern is written.

Referring to FIG. 6, the substrate 101 has a plurality of chip areas C. A pattern 110 corresponding to the aperture opening is written in each chip area C.

Figure 7A:
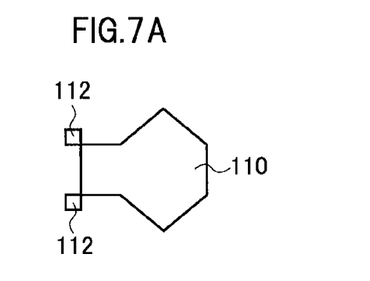
FIGS. 7A and 7B are diagrams explaining a method of writing a pattern.
Figure 7B:
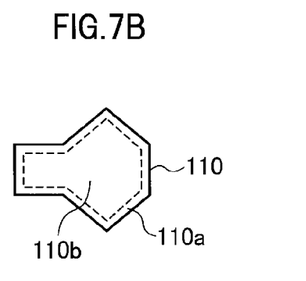

To increase shaping accuracy of a right-angled portion of the pattern 110 and that of a linear portion thereof, an assist pattern 112 is written at each right-angled portion as illustrated in FIG. 7A. Furthermore, in order to reduce edge roughness of the pattern 110, the pattern 110 is written such that pattern edge part 110a is given a higher dose than pattern central part 110b other than the pattern edge part 110a as illustrated in FIG. 7B.

Writing conditions, for example, the size and position of each assist pattern 112 and the dose to the pattern edge part 110a, are varied for each chip area C illustrated in FIG. 6 to write the pattern 110. Multi-writing may be performed in order to increase writing accuracy.

Figure 5B:
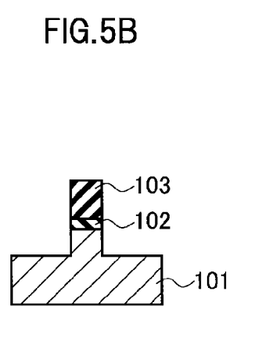
Figure 5C:
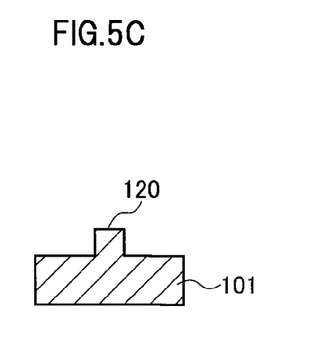

[Step S102] As illustrated in FIG. 5B, after development, the resist 103 is used as a mask and the chromium film 102 and the substrate 101 are processed by dry etching. After that, the resist 103 and the chromium film 102 are removed as illustrated in FIG. 5C. Consequently, the substrate 101 with a pattern 120 corresponding to the aperture opening is obtained. FIGS. 5A to 5C illustrate a cross-section of one chip area C.

[Step S103] Dimensions and position coordinates of the pattern 120 formed in each chip area C are measured, thus obtaining dimensional accuracy and edge positional accuracy of the pattern 120. The measurement is performed for each substrate 101 having the chip areas C. Accordingly, a dimension measuring device and a position coordinate measuring device can be used.

[Step S104] If there is a pattern 120 which satisfies desired accuracy in terms of size and edge position, the method proceeds to step S105. If there is no pattern 120 which satisfies the desired accuracy, the method returns to step S101. The writing conditions are changed and the above-described steps are performed to form the pattern 110.

Figure 8:
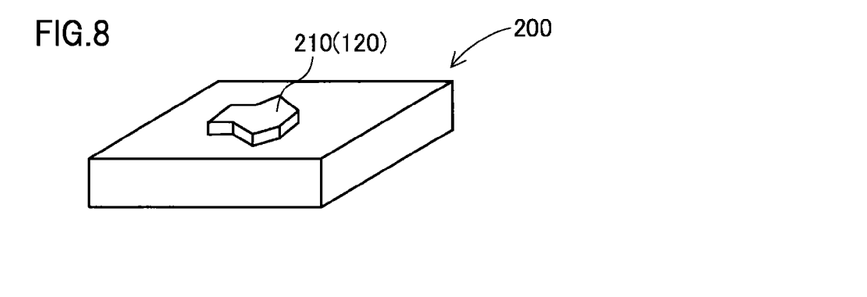
FIG. 8 is a perspective view of the template in the embodiment.

[Step S105] The chip area C including the pattern 120 which satisfies the desired accuracy in terms of size and edge position is diced, or cut out from the substrate 101. Consequently, a master template 200 having a protrusion 210 corresponding to the aperture opening is produced as illustrated in FIG. 8. The protrusion 210 corresponds to the pattern 120. If there are a plurality of patterns 120 which satisfy the desired accuracy, the pattern 120 with the highest accuracy is selected and the chip area C including the selected pattern 120 is cut out. The template 200 may include a protruding frame on its periphery.

Figure 9A:
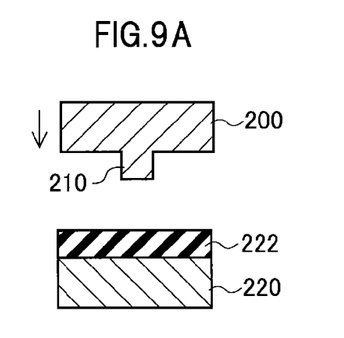
FIGS. 9A, 9B, 9C, 9D, and 9E are cross-sectional views explaining a method of producing an aperture in accordance with the embodiment.

[Step S106] The template 200 is used for imprinting to transfer a template pattern to a resist on a substrate. Specifically, as illustrated in FIG. 9A, a pattern surface including the protrusion 210 of the template 200 is come into contact with a resist 222 applied to a substrate 220. The substrate 220 is a material to be an aperture member. The substrate 220 is, for example, an SOI substrate including a silicon substrate, an insulating layer composed of a silicon oxide film or a silicon nitride film, and a semiconductor layer composed of a silicon film or the like. The resist 222 is, for example, an ultraviolet or UV curable resist and is composed of an UV curable resin that is curable by UV irradiation.

Figures 9B, 9C:
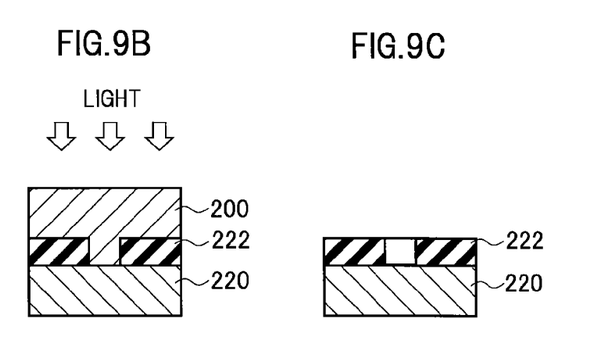

Referring to FIG. 9B, a recess of the template pattern is filled with the resist 222. The resist 222 is then irradiated with energy rays, thus hardening the resist 222. The energy rays are, for example, UV rays.

The resist 222 is not limited to the UV curable resist. For example, a thermosetting resist that is curable by heating can be used. In this case, heat may be applied to the thermosetting resist through the substrate 220 by a hot plate, thus hardening the resist.

Referring to FIG. 9C, the template 200 is separated from the resist 222. The resist 222, which has already been hardened in this state, is maintained in the same condition (form) as that during contact with the template 200. This allows the resist 222 to be patterned with a transfer pattern corresponding to the template pattern.

Figure 9D:
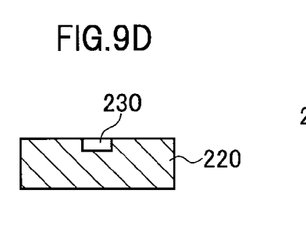

[Step S107] Referring to FIG. 9D, the resist 222 is used as a mask and the substrate 220 is processed by dry etching, thus forming a recess 230 in a front surface of the substrate 220. For example, the substrate 220 has a thickness of several hundreds of μm and the recess 230 has a depth of several tens of μm. After formation of the recess 230, the resist 222 is removed.

Figure 9E:
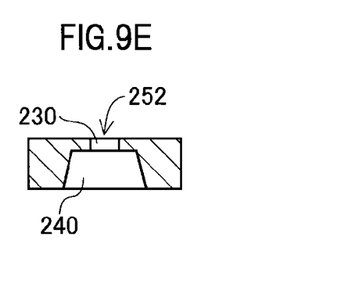

After that, as illustrated in FIG. 9E, a region of a rear surface of the substrate 220 opposite the recess 230 is etched, thus forming a recess 240. The recess 240 communicates with the recess 230, so that an opening 252 extending through the substrate 220 is formed. The recess 240 has a (lateral) dimension greater than the recess 230, such that the whole of an opening defined by the recess 230 can be viewed from the rear surface of the substrate 220. For example, the recess 230 has a dimension of several μm and the recess 240 has a dimension of several hundreds of μm to several mm.

Figure 10:
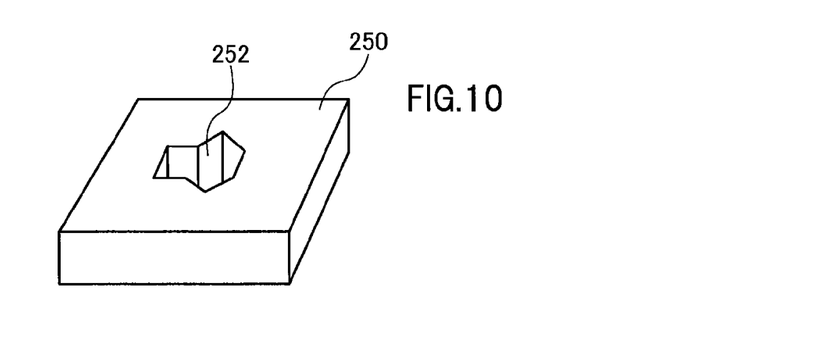
FIG. 10 is a perspective view of the aperture in the embodiment.

[Step S108] A chip including the opening 252 is cut out from the substrate 220 by dicing. As regards the size of the cut-out chip, for example, the chip is several mm square. Consequently, an aperture member 250 having an aperture opening (opening 252) is produced as illustrated in FIG. 10.

The aperture member 250 produced in the above-described manner is attached as the second aperture member 524 to the electron beam writing apparatus.

The patterns 120 formed under different writing conditions in the substrate 101 can be checked by the dimension measuring device and the position coordinate measuring device, thus obtaining accuracy in size and edge position of each pattern. A pattern 120 with high accuracy is selected from the patterns 120 and the selected pattern 120 is cut out from the substrate 101, thus producing the template 200 having a high-accuracy template pattern shape. This template 200 is used for imprinting to form an aperture opening. Thus, an aperture member having a desired sized and shaped opening can be produced.

Furthermore, the template 200 can be repeatedly used. A plurality of aperture members each having the desired sized and shaped opening can be made with high reproducibility by performing imprinting at multiple times. These aperture members attached to different electron beam writing apparatuses exhibit a small variation in aperture opening shape among the apparatuses. This facilitates setting of the writing apparatuses.

According to the embodiment, the aperture members each having the desired sized and shaped opening can be made with high reproducibility as described above.

Figure 11:
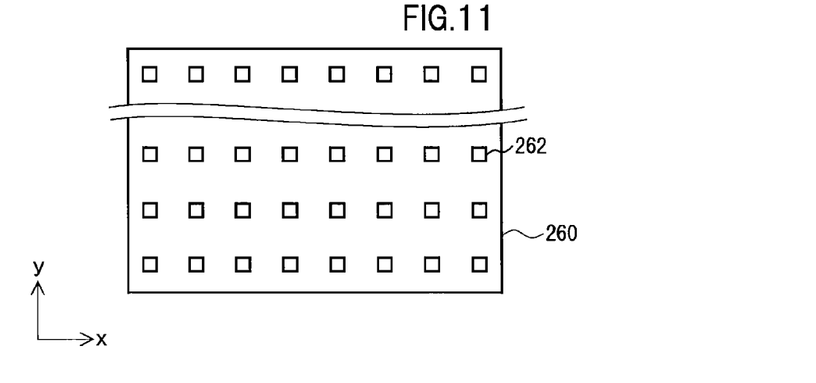
FIG. 11 is a diagram illustrating an aperture member used in a multi-beam writing apparatus.

The aperture member made by the method according to the embodiment is not limited to an aperture member used in a single beam writing apparatus for writing with a single electron beam, but may be an aperture member having a plurality of openings used in a multi-beam writing apparatus. The multi-beam writing apparatus may use an aperture member 260 having holes (openings) 262 arranged in a matrix of m columns extending longitudinally (in a y direction)×n rows extending laterally (in an x direction) (m, n≥2) at a predetermined pitch as illustrated in FIG. 11. An electron beam partly passes through the holes 262, thus forming multiple beams.

The embodiment has been described with respect to the case where the recess 230 is formed by imprinting and etching and the recess 240 is then formed in the rear surface of the substrate 220 as illustrated in FIGS. 9A to 9E, the recess 230 may be formed after formation of the recess 240.

Figure 12A:
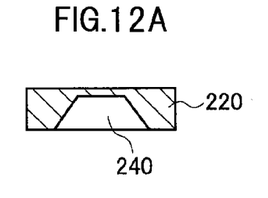
FIGS. 12A, 12B, 12C, and 12D are diagrams explaining a method of producing an aperture in accordance with a modification.
Figure 12B:
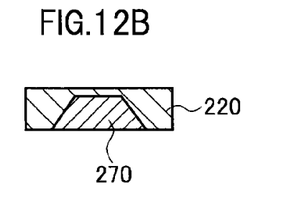

For example, as illustrated in FIG. 12A, the rear surface of the substrate 220 is etched, thus forming the recess 240. The recess 240 is then filled with a filler 270 as illustrated in FIG. 12B. As regards the filler 270, a material that dissolves in acid may be used. For example, metal, such as aluminum, tungsten, tantalum, or molybdenum, or acrylic resin, such as polyimide or PMMA (polymethyl methacrylate resin), can be used.

Figure 12C:
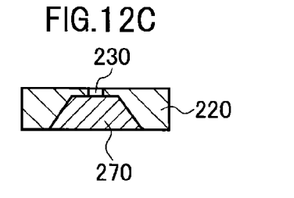

After that, the resist 222 is applied to the front surface of the substrate 220 and the same processes as those in FIGS. 9A to 9D are performed, thus forming the recess 230 in the front surface of the substrate 220. The recess 230 is formed such that the filler 270 is exposed as illustrated in FIG. 12C.

Figure 12D:
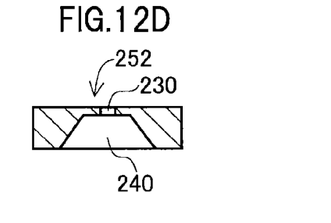

Then, the filler 270 is dissolved and removed with acid as illustrated in FIG. 12D. Consequently, the recess 240 communicates with the recess 230, so that the opening 252 extending through the substrate 220 is formed. As described above, the method of forming the recess 240 and then forming the recess 230 also enables aperture members each having the desired sized and shaped opening to be made with high reproducibility.

Figure 13A:
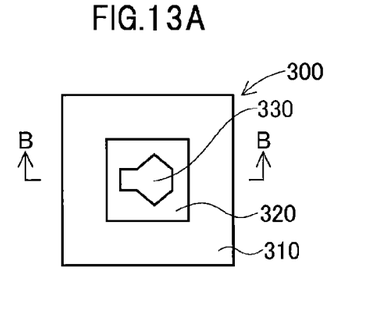
FIG. 13A is a top view of a template in the modification and FIG. 13B is a cross-sectional view of the template.
Figure 13B:
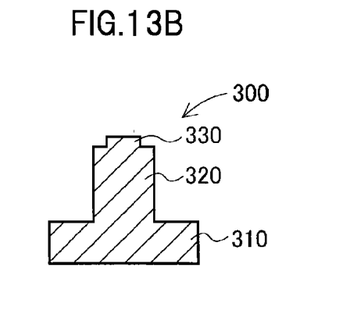

The recess 240 may be formed in the rear surface of the substrate 220 and imprinting may be performed in the recess 240 to form the opening 252. In this case, a two-stepped template 300, as illustrated in FIG. 13, is used for imprinting. FIG. 13A is a top view of the master template 300 and FIG. 13B is a cross-sectional view thereof taken along a line B-B in FIG. 13A.

The template 300 includes a base 310, a first protrusion 320 provided on the base 310, and a second protrusion 330 formed on the first protrusion 320. The area of a cross-section of the first protrusion 320 parallel to the surface of the substrate is smaller than that of the recess 240 parallel thereto. In addition, the first protrusion 320 has a height greater than the depth of the recess 240. The second protrusion 330 has a shape corresponding to the aperture opening.

To produce the template 300, first, a substrate is subjected to first lithography, thus forming the first protrusion 320. A pattern shape of the first protrusion 320 does not require high accuracy. Exposure light and etching in the first lithography are not particularly limited.

After formation of the first protrusion 320, the second protrusion 330 is formed by second lithography. A pattern shape of the second protrusion 330 requires high accuracy. Accordingly, a pattern is written on a resist by using an electron beam writing apparatus. The substrate has a plurality of chip areas. The first protrusion 320 and the second protrusion 330 are formed in each chip area. The pattern of the second protrusion 330 is written under writing conditions varied for each chip area.

The size and edge position of the second protrusion 330 in each chip area are measured. A chip area provided with the second protrusion 330 satisfying desired accuracy is cut out from the substrate, thus producing the template 300.

Figure 14A:
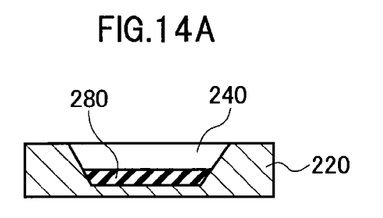
FIGS. 14A, 14B, 14C, and 14D are cross-sectional views explaining the method of producing an aperture in accordance with the modification.

Imprinting using the template 300 will now be described with reference to FIGS. 14A to 14D. In FIGS. 14A to 14D, the rear surface of the substrate faces upward. First, the rear surface of the substrate 220 is etched as illustrated in FIG. 14A, thus forming the recess 240. A resist 280 is applied to the recess 240. As regards the resist 280, the same material as that of the resist 222 can be used.

Figure 14B:
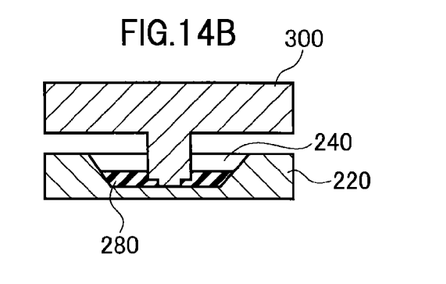

Next, a pattern surface including the second protrusion 330 of the template 300 is come into contact with the resist 280 as illustrated in FIG. 14B. Since the first protrusion 320 has a smaller cross-sectional area than the recess 240 and the height of the first protrusion 320 is greater than the depth of the recess 240, the second protrusion 330 can be come into contact with the resist 280. A recess of a template pattern is filled with the resist 280. After that, the resist 280 is irradiated with energy rays, thus hardening the resist 280.

Figure 14C:
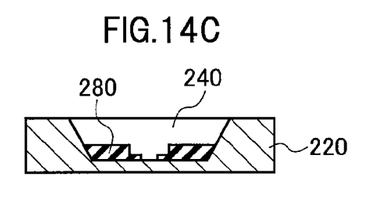

Then, as illustrated in FIG. 14C, the template 300 is separated from the resist 280. The resist 280, which has already been hardened in this state, is maintained in the same condition (form) as that during contact with the template 300. This allows the resist 280 to be patterned with a transfer pattern corresponding to the template pattern.

Figure 14D:
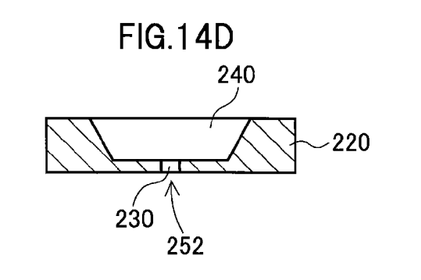

After that, as illustrated in FIG. 14D, the resist 280 is used as a mask and the substrate 220 is processed by dry etching, thus forming the recess 230 extending through the substrate 220. After formation of the recess 230, the resist 280 is removed. Thus, the opening 252 extending through the substrate 220 is formed. As described above, such a method of performing imprinting on the rear surface of the substrate 220 also enables aperture members each having the desired sized and shaped opening to be made with high reproducibility.

In the above-described embodiment, the substrate 220 may include a conductive layer. The conductive layer may be connected to ground potential when used in the electron beam writing apparatus such that applied electrons escape to the ground. As regards the conductive layer, a metal having low electrical resistance may be used. For example, a tungsten film, an iridium film, a platinum film, or a titanium film can be used.

A material of the substrate 220 is not limited to a material containing silicon. For example, ceramic, such as alumina, or metal, such as tantalum or titanium, may be used.

Although FIG. 7A illustrates the case where the assist pattern 112 is written at each right-angled portion, the assist pattern 112 may be written at any position. For example, the assist pattern may be written at each vertex of the hexagon.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of producing an aperture member for a charged particle beam apparatus, the method comprising:

applying a charged particle beam to a plurality of chip areas on a first substrate while changing a writing condition to write a first pattern corresponding to an aperture opening in each chip area;

processing the first substrate based on the written first pattern to form a second pattern;

measuring dimensional accuracy and edge positional accuracy of the second pattern in each chip area;

cutting out a chip area provided with the second pattern having desired dimensional accuracy and desired edge positional accuracy from the first substrate to produce a template;

allowing a template pattern of the template including the second pattern to come into contact with a resist overlying a front surface of a second substrate;

hardening the resist;

separating the template from the hardened resist to pattern the resist with a transfer pattern corresponding to the template pattern;

processing the second substrate using the transfer pattern as a mask to form a first recess in the front surface; and etching a rear surface of the second substrate to form a second recess communicating with the first recess such that an opening extending through the second substrate is formed.

2. The method according to claim 1, wherein the first pattern is written while changing an assist pattern for each chip area.

3. The method according to claim 1, wherein the first pattern is written such that pattern edge part of the first pattern is given a higher dose than pattern central part thereof.

4. The method according to claim 3, wherein the first pattern is written while changing the dose to the pattern edge part for each chip area.

5. The method according to claim 1, wherein the aperture opening is shaped in an octagon including a hexagonal portion and a rectangular portion connecting to the hexagonal portion.

6. A method of producing an aperture member for a charged particle beam apparatus, the method comprising:
   applying a charged particle beam to a plurality of chip areas on a first substrate while changing a writing condition to write a first pattern corresponding to an aperture opening in each chip area;
   processing the first substrate based on the written first pattern to form a second pattern;
   measuring dimensional accuracy and edge positional accuracy of the second pattern in each chip area;
   cutting out a chip area provided with the second pattern having desired dimensional accuracy and desired edge positional accuracy from the first substrate to produce a template;
   etching a rear surface of a second substrate to form a first recess;
   filling the first recess with a filler;
   allowing a template pattern of the template including the second pattern to come into contact with a resist overlying a front surface of the second substrate;
   hardening the resist;
   separating the template from the hardened resist to pattern the resist with a transfer pattern corresponding to the template pattern;
   processing the second substrate using the transfer pattern as a mask to form a second recess through which the filler is exposed; and
   removing the filler such that the first recess communicates with the second recess to form an opening extending through the second substrate.

7. The method according to claim 6, wherein the first pattern is written while changing an assist pattern for each chip area.

8. The method according to claim 6, wherein the first pattern is written such that pattern edge part of the first pattern is given a higher dose than pattern central part thereof.

9. The method according to claim 8, wherein the first pattern is written while changing the dose to the pattern edge part for each chip area.

10. The method according to claim 6, wherein the aperture opening is shaped in an octagon including a hexagonal portion and a rectangular portion connecting to the hexagonal portion.

11. A method of producing an aperture member for a charged particle beam apparatus, the method comprising:
   applying a charged particle beam to a plurality of chip areas on a first substrate while changing a writing condition to write a first pattern corresponding to an aperture opening in each chip area;
   processing the first substrate based on the written first pattern to form a second pattern;
   measuring dimensional accuracy and edge positional accuracy of the second pattern in each chip area;
   cutting out a chip area provided with the second pattern having desired dimensional accuracy and desired edge positional accuracy from the first substrate to produce a template;
   etching a rear surface of a second substrate to form a recess;
   applying a resist to the recess;
   allowing a template pattern of the template including the second pattern to come into contact with the resist;
   hardening the resist;
   separating the template from the hardened resist to pattern the resist with a transfer pattern corresponding to the template pattern; and
   processing the second substrate using the transfer pattern as a mask to form an opening extending through the second substrate.

12. The method according to claim 11, wherein the first pattern is written while changing an assist pattern for each chip area.

13. The method according to claim 11, wherein the first pattern is written such that pattern edge part of the first pattern is given a higher dose than pattern central part thereof.

14. The method according to claim 13, wherein the first pattern is written while changing the dose to the pattern edge part for each chip area.

15. The method according to claim 11, wherein the aperture opening is shaped in an octagon including a hexagonal portion and a rectangular portion connecting to the hexagonal portion.

16. The method according to claim 11,
   wherein the template includes a base, a first protrusion on the base, and a second protrusion on the first protrusion, and
   wherein the second protrusion corresponds to the second pattern.

17. The method according to claim 16, wherein the first protrusion has a height greater than a depth of the recess.

* * * * *